(12) United States Patent
Kang et al.

(10) Patent No.: US 11,036,904 B2
(45) Date of Patent: Jun. 15, 2021

(54) APPARATUS AND METHOD FOR TERNARY LOGIC SYNTHESIS WITH MODIFIED QUINE-MCCLUSKEY ALGORITHM

(71) Applicant: POSTECH Research and Business Development Foundation, Pohang-si (KR)

(72) Inventors: Seokhyeong Kang, Pohang-si (KR); Sunmean Kim, Pohang-si (KR); Sung-Yun Lee, Busan (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 0 days.

(21) Appl. No.: 16/714,583

(22) Filed: Dec. 13, 2019

(65) Prior Publication Data

US 2020/0210637 A1     Jul. 2, 2020

(30) Foreign Application Priority Data

Dec. 31, 2018 (KR) .................. 10-2018-0173933

(51) Int. Cl.
  *G06F 30/327* (2020.01)
  *G06F 30/373* (2020.01)
  *H03K 19/0944* (2006.01)
  *H03K 19/094* (2006.01)

(52) U.S. Cl.
  CPC ....... *G06F 30/327* (2020.01); *H03K 19/0944* (2013.01); *H03K 19/09425* (2013.01)

(58) Field of Classification Search
  CPC ............... G06F 30/327; G06F 30/373; H03K 19/09425; H03K 19/0944; H03K 19/094
  See application file for complete search history.

(56) References Cited

U.S. PATENT DOCUMENTS

| 3,129,340 A * | 4/1964 | Baskin ............... H03K 19/0002 326/59 |
| 9,287,867 B2 * | 3/2016 | Nakanishi .......... H03K 19/0002 |
| 2013/0019215 A1 * | 1/2013 | Swann .................. G06F 30/327 716/102 |

FOREIGN PATENT DOCUMENTS

KR    10-1928223    12/2018

OTHER PUBLICATIONS

Y. Taur, "CMOS design near the limit of scaling", IBM Journal of Research and Development 43(2.3) (2002), pp. 213-222.
J. Deng and H.-S. P. Wong, "A compact SPICE model for carbon-nanotube field-effect transistors including nonidealities and its application—Part I: Model of the intrinsic channel region", IEEE Transactions on Electron Devices 54(12)(2007), pp. 3186-3194.
R. Ho, K.W.Mai and M.A.Horowitz, "The future of wires", Proc. of the IEEE 89(4)(2001), pp. 490-504.

(Continued)

*Primary Examiner* — Vuthe Siek
(74) *Attorney, Agent, or Firm* — Morgan, Lewis & Bockius LLP (57) ABSTRACT

Provided is a ternary logic synthesis method at least temporarily performed by a computer, the ternary logic synthesis method including generating a switching table with respect to pull-up and pull-down circuits using a truth table corresponding to a ternary function, converting the switching table into a sum of products (SOP) using a Quine-McCluskey algorithm, minimizing the SOP, and mapping a transistor corresponding to the SOP.

5 Claims, 4 Drawing Sheets

(56) References Cited

OTHER PUBLICATIONS

Y. Kang et al., "A novel ternary multiplier based on ternary CMOS compact model", 2017 IEEE 47th ISMVL, 2017, pp. 25-30.

X.W.Wu and F.P.Propessr, "CMOS ternary logic circuits", IEE Proceedings G-Circuits, Devices and Systems 137(1) (1990), pp. 21-27.

A. Raychowdhury and K. Roy, "Carbon-nanotube-based voltage-mode multiple-valued logic design", IEEE Transactions on Nanotechnology 4(2)(2005), pp. 168-179.

C-H. Shim et al., "Design of ratioless ternary inverter using graphene barrister", IEEE 46th ISMVL, 2016. pp. 23-30.

S. Lin, Y. Kim and F. Lombardi, "A novel CNTFET-based ternary logic gate design", IEEE 52nd International Midwest Symposium on Circuits and Systems, 2009, pp. 435-438.

W.V.O.Quine, "The problem of simplifying truth functions", The American Mathematical Monthly 59(8) (1952). pp, 627-631.

W.V.O.Quine, "A way to simplify truth functions", The American Mathematical Monthly 62(9) (1955), pp. 627-631.

E.J. McCluskey, "Minimization of Boolean functions", Bell System Technical Journal 35(6) (1956), pp. 1417-1444.

M.G. Karpovsky, R.S.Stankovic and J.T.Astola, Spectral logic and its applications for the design of digital devices, Wiley, 2008.

D.M. Millet and M. Soeken, "A spectral algorithm for ternary function classification", IEEE 48th ISMVL, 2018, pp. 198-203.

S. Lin, Y. Kim and F. Lombardi, "CNTFET-based design of ternary logic gates and arithmetic circuits", IEEE Transactions on Nanotechnology, 10(2) (2011), pp. 217-225.

B. Srinivasu and K. Sridharan, "A synthesis methodology for ternary logic circuits in emerging device technologies", IEEE Transactions on Circuits and Systems I: Regular Papers 64(8) (2017), pp. 2146-2159.

C. Vudadha, A. Surya S. Agrawal and M.B. Srinivas, "Synthesis of ternary logic circuits using 2:1 multiplexers", IEEE Transactions on Circuits and Systems I: Regular Papers 65(12)(2018), pp. 4313-4325.

Jie Deng et al., "A Compact SPICE Model for Carbon-Nanotube Field-Effect Transistors Including Nonidealities and Its Application: Part II. Full Device Model and Circuit Performance Benchmarking", IEEE Transactions on Electron Devices, vol. 54, No. 12, Dec. 2007.

* cited by examiner

| Operator | $A_0$ | $A_0 + A_1$ | $A_0 + A_2$ | $A_1$ | $A_1 + A_2$ | $A_2$ |
|---|---|---|---|---|---|---|
| Pull-up network | $A$ —◧<br>$V_{th} = -0.559$ | $A$ —◻<br>$V_{th} = -0.289$ | $A$ —◧—◻— $A_P$ | $A$ —◻<br>$A_N$ —◻ | $A_N$ —◻ | $A_P$ —◻ |
| Pull-down network | $A_N$ —◻ | $A_P$ —◻ | $A_N$ —◻—◧— $A$ | $A_P$ —◻<br>$A$ —◻ | $A$ —◻<br>$V_{th} = 0.289$ | $A$ —◧<br>$V_{th} = 0.559$ |

APPARATUS AND METHOD FOR TERNARY LOGIC SYNTHESIS WITH MODIFIED QUINE-MCCLUSKEY ALGORITHM

STATEMENT REGARDING FOREIGN GOVERNMENT RIGHTS

This invention was made with Korean government support under Project No. 2016M3A7B4909943 (Research Program: Nano-Material Technology Development Program) support awarded by Ministry of Science and ICT (Research management institution: National Research Foundation of Korea (NRF)).

This invention was made with Korean government support under Project No. 2017M3D1A1040834 (Research Program: Creative Materials Discovery Program) support awarded by Ministry of Science and ICT (Research management institution: National Research Foundation of Korea (NRF)).

This invention was made with Korean government support under Project No. 2019M3F3A1A01074453 (Research Program: Multi-Value Logic Device Integration Process and Architecture Platform Research) support awarded by Ministry of Science and ICT (Research management institution: National Research Foundation of Korea (NRF)).

This invention was made with Korean government support under Project No. IITP-2019-2011-1-00783 (Research Program: Information Technology Research Center support Program) support awarded by Ministry of Science and ICT (Research management institution: Institute for Information & Communications Technology Planning & Evaluation (IITP)).

CROSS-REFERENCE TO RELATED APPLICATION(S)

This application claims the benefit of Korean Patent Application No. 10-2018-0173933, filed on Dec. 31, 2018, in the Korean Intellectual Property Office, the disclosure of which is incorporated herein by reference.

BACKGROUND

1. Field of the Invention

One or more example embodiments relate to a field of circuit design, and more particularly, to an apparatus and method for synthesizing a ternary logic circuit.

2. Description of the Related Art

Reduction in the size of a transistor increases a speed of a digital circuit, reduces a power consumption, and reduces a required area, thereby improving the efficiency. However, due to the characteristics of a complementary metal-oxide-semiconductor (CMOS), the size reduction reached its limitations, and a new type of transistor is required for a digital circuit.

As the new type of transistor, a carbon nanotube field-effect transistor (CNTFET) has been developed. The CNTFET operates at a lower voltage than the CMOS. However, due to a delay issue of wires, there is a demand for developing a method of overcoming the delay issue using a multi-valued logic (MVL).

RELATED ART DOCUMENT

Non-Patent Document

"A novel CNTFET-based ternary logic gate design" was published in 2009 52nd IEEE International Midwest Symposium on Circuits and Systems (on Sep. 15, 2009).

SUMMARY

According to an aspect, there is provided a ternary logic synthesis method at least temporarily performed by a computer, the ternary logic synthesis method including generating a switching table with respect to pull-up and pull-down circuits using a truth table corresponding to a ternary function, converting the switching table into a sum of products (SOP) using a Quine-McCluskey algorithm, minimizing the SOP, and mapping a transistor corresponding to the SOP.

The ternary logic synthesis method may further include, before the converting, processing a don't-care term of the switching table.

The processing may include processing the don't-care term by inserting ON or OFF into the don't-care term.

The minimizing may include converting a plurality of switching tables generated by inserting ON or OFF into the don't-care term, into respective SOPs, and setting an SOP having a smallest transistor count, among the plurality of SOPs generated from the respective switching tables, as a minimized SOP, for each switching table.

The mapping may include calculating the number of CNTFETs having a predesignated chirality vector, selecting an SOP with having the smallest number of CNTFETs having the predesignated chirality vector, and mapping a transistor corresponding to the selected SOP having the smallest number of CNTFETs.

According to another aspect, there is provided a non-transitory computer-readable storage medium storing instructions that, when executed by a processor, cause the processor to perform a ternary logic synthesis method.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, reference will now be made in detail to example embodiments with reference to the accompanying drawings, wherein like reference numerals refer to like elements throughout. However, the scope of the disclosure is not limited by those example embodiments.

The terms used herein are mainly selected from general terms currently being used in related art(s). However, other terms may be used depending on development and/or changes in technology, custom, or a preference of an operator. Thus, it should be understood that the terms used herein are terms merely used to describe the example embodiments, rather terms intended to limit the spirit and scope of this disclosure.

In addition, in a specific case, most appropriate terms have been arbitrarily selected by the inventors for ease of description and/or for ease of understanding. In this instance, the meanings of the arbitrarily used terms will be clearly explained in the corresponding description. Hence, the terms should be understood not by the simple names of the terms, but by the meanings of the terms and the following overall description of this specification.

Logic Synthesis and Ternary Circuit

A logic synthesis is important to expedite the development of a high-level system. However, a multi-valued logic (MVL), the development of a logic synthesis method using a new device (or transistor) is needed.

A method of synthesizing a ternary logic circuit by means of a computer according to an example embodiment will be described. Herein, the ternary logic circuit may be based on a static gate design, and uses a carbon nanotube field-effect transistor (CNTFET).

Downscaling of a transistor may increase a speed of a digital circuit, reduce a power consumption, and reduce a required area, thereby improving the circuit efficiency. However, downscaling of the transistor reached its limitations due to the characteristics of a complementary metal-oxide-semiconductor (CMOS). A CNTFET according to an example embodiment may be reduced to the size below 10 nanometers (nm) by a ballistic transport of charged carriers.

Meanwhile, despite the development of reduction technology, the length of a wire between logic gates was not reduced, when compared to the size of the gates. As a result, the resistance of the wire relatively increased when compared to the resistance of the logic gates, and a delay in the wire became dominant over a delay in the logic gates in the digital circuit. Since the delay in the wire restricts the speed of the digital circuit, such a delay may be alleviated by reducing the number of wires between the logic gates, and thus use of a multi-valued logic circuit is needed.

The multi-valued logic circuit refers to a circuit in which a logic gate may process two or more logical values including "0" or "1". Thus, the multi-valued logic circuit requires fewer logic gates and wires to implement the same digital circuit, when compared to a binary logic circuit.

One example thereof is a ternary logic circuit, and various new devices such as a ternary CMOS, a multi-threshold voltage CMOS, a CNTFET, and a graphene barrister were applied to the ternary logic circuit. To effectively implement the ternary logic circuit, three types of transistors having different threshold voltages are used. In addition to the advantage of downscaling, the CNTFET may obtain a desired threshold voltage depending on the diameter of a carbon nanotube (CNT).

A logic synthesis refers to a process of synthesizing a logic circuit satisfying a truth table representing desired logical functions. An application-specific integrated circuit (ASIC) may be immediately manufactured by utilizing the logic synthesis. Further, the logic synthesis may be used to develop a high-level digital circuit.

However, a logic synthesis method for a ternary logic circuit has not been developed. There is no optimal logic synthesis method that may process three logical values. In addition, an existing logic synthesis method may not consider intrinsic characteristics of new devices such as the CNTFET. Accordingly, there is a need for a logic synthesis method suitable for a ternary logic circuit using a new device.

A method of synthesizing a ternary logic based on a static gate design according to an example embodiment will be described. First, in a ternary logic synthesis process, a truth table may be converted into a pull-up/pull-down table representing switch operations of respective networks of a static gate. Minterm canonical expressions may be extracted from the pull-up/pull-down table.

Next, the expressions may be optimized to sum of products (SOP) expressions to reduce a transistor count needed for a logic circuit. To reduce the transistor count of the ternary logic circuit, a Quine-McCluskey algorithm may be modified and applied. Last, an optimization process may be performed to minimize a transmission delay.

The operations will be described in detail with reference to FIG. 2. A static gate design-based ternary logic circuit may be synthesized by a computer using a ternary logic synthesis method according to an example embodiment.

Carbon Nanotube Field-Effect Transistor (CNTFET)

A CNTFET is a field-effect transistor with a single-walled carbon nanotube (SWCNT) inserted. A MOSFET-like CNTFET includes drain, gate, source, and body terminals. A carbon nanotube may operate as a semiconductor or a conductor depending on a chirality vector. The chirality vector may indicate an arrangement angle of carbon atoms. The vector may be expressed as (n, m), and be a main factor which determines a threshold voltage of the CNTFET. The threshold voltage of the CNTFET may be inversely proportional to the diameter of the carbon nanotube, and the diameter may be expressed by Equation 1.

$$D_{CNT} = \frac{\sqrt{3}\,a_0}{\pi}\sqrt{n^2 + m^2 + nm} \qquad \text{[Equation 1]}$$

In Equation 1, $a_0$ denotes a distance between adjacent carbon atoms, and may be 0.142 nm. Thus, the threshold voltage of the CNTFET may be inversely proportional to n, if m of the chirality vector is "0".

The following Table 1 represents diameters of carbon nanotubes and threshold voltages depending on respective chirality vectors. Three types of CNTFETs having different threshold voltages were used for n-type and p-type transistors. The threshold voltages are determined based on an operation of a ternary logic circuit when an operating voltage is provided as 0.9 volts (V).

TABLE 1

| (n, m) | $D_{CNT}$ (nm) | $V_{thn}$ (V) | $V_{thp}$ (V) |
|---|---|---|---|
| (19, 0) | 1.487 | 0.289 | −0.289 |
| (13, 0) | 1.018 | 0.428 | −0.428 |
| (10, 0) | 0.783 | 0.559 | −0.559 |

The ternary logic circuit uses an ON/OFF state switching operation of the CNTFET. The ON/OFF switching operation is based on the principle that a source-drain current of the CNTFET is determined by a gate voltage. Similar to an operation of the CMOS, a normal operation is that a current does not flow when the gate voltage of the p-type CNTFET is $V_{DD}$, and the CNTFET is in an OFF state. When the gate voltage is Ground, the CNTFET is in an ON state.

Conversely, the n-type CNTFET is in the ON state when the gate voltage is $V_{DD}$, and is in the OFF state when the gate voltage is Ground. When the gate voltage is half $V_{DD}$, the p-type and n-type CNTFETs having a chirality vector of (19, 0) are in the ON state, and the CNTFET of (10, 0) is OFF.

Static Gate Design

Figure 1:
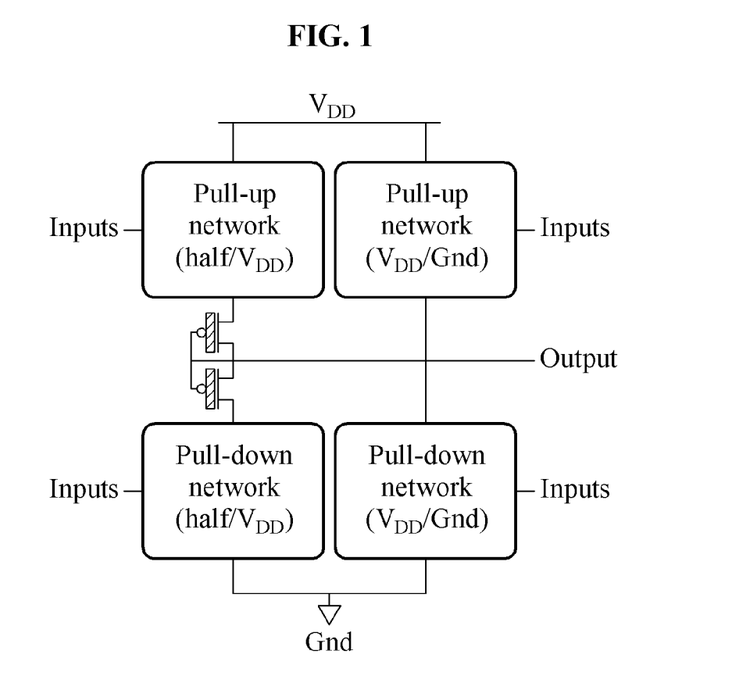
FIG. 1 is a diagram illustrating a static gate design for a ternary logic gate according to an example embodiment.

FIG. 1 is a diagram illustrating a static gate design for a ternary logic gate according to an example embodiment.

A static gate includes a pull-up network and a pull-down network. The pull-up network is connected to $V_{DD}$, and configured as a p-type transistor. Conversely, the pull-down network is connected to Ground, and configured as an n-type transistor.

A static gate design for a ternary logic gate using a CNTFET is proposed. In FIG. 1, there are two paths, a $V_{DD}$/Gnd path and a half-$V_{DD}$ path. While the $V_{DD}$/Gnd path is activated, switching operations of the pull-up network and the pull-down network are reversed, and the ON/OFF states are reversed. That is, when the pull-up network is in the ON state, and the pull-down network is in the OFF state, an output value is $V_{DD}$.

Conversely, when the pull-up network is OFF, and the pull-down network is ON, the output value is Ground. When the $V_{DD}$/Gnd path is deactivated, the output value may be $V_{DD}/2$ due to the activated half-$V_{DD}$ path. When the half-$V_{DD}$ path is activated, the voltage may be divided through a diode-connected transistor using CNTFETs having a chirality vector (13, 0). The four networks may be configured using a device switching table represented in Table 2.

TABLE 2

| Operator | A0 | A0 + A1 | A0 + A2 | A1 | A1 + A2 | A2 |
|---|---|---|---|---|---|---|
| Input = 0 | ON | ON | ON | OFF | OFF | OFF |
| Input = 1 | OFF | ON | OFF | ON | ON | OFF |
| Input = 2 | OFF | OFF | ON | OFF | ON | ON |

A switching table needed for configuring the pull-up/pull-down networks depending on a switching operation of a single input variable is illustrated.

Figure 3:
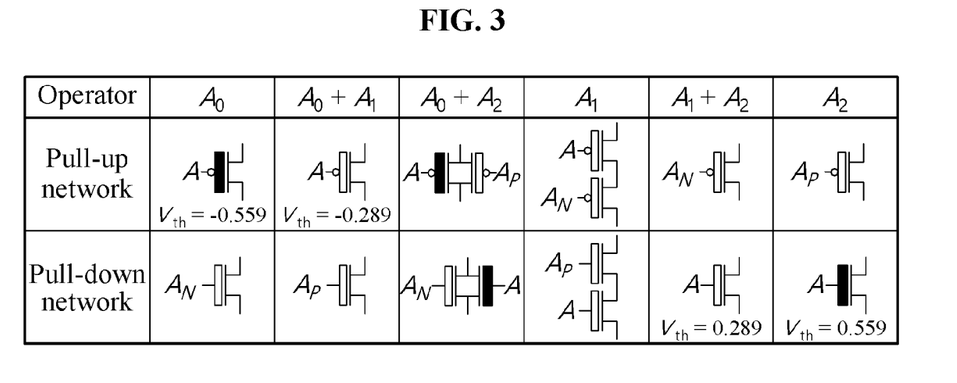
FIG. 3 illustrates carbon nanotube field-effect transistors (CNTFETs) corresponding to pull-up/pull-down according to an example embodiment.

Meanwhile, CNTFETs corresponding to pull-up and pull-down of each operator described in the above Table 2 are illustrated in FIG. 3.

FIG. 3 illustrates examples of CNTFETs corresponding to pull-up/pull-down networks according to an example embodiment. It may be verified that two transistors are used in $A_0+A_2$ and $A_1$. In a minimization operation to reduce the number of transistors to be used, calculation for the two cases ($A_0+A_2$, $A_1$) is performed by applying a weight, which will be described later in detail.

Ternary Logic Circuit

A ternary logic includes an unbalanced ternary logic which uses "0, 1, and 2" and a balanced ternary logic which uses "−1, 0, and 1". The balanced ternary logic does not use a trit which is an additional ternary digit when implementing a signed arithmetic and logic unit.

A ternary logic synthesis scheme according to an example embodiment may be applied to both the unbalanced and balanced ternary logics. As a non-limiting example, the description will be provided based on the unbalanced ternary logic. The values "0, 1, and 2" of the unbalanced ternary logic correspond to the voltage ground Gnd, Half-$V_{DD}$ ($V_{DD}/2$), and $V_{DD}$, respectively.

A ternary function Y=f(x) indicates an operation using a ternary logic. Basic ternary functions corresponding to basic binary functions (Negation, Or, and And) may be expressed as follows, if $X_i$, $X_j \in \{0,1,2\}$.

$Y_{neg} = \overline{X_i} = 2 - X_i$ $Y_{or} = X_i \vee X_j = \max\{X_i, X_j\}$ $Y_{and} = X_i \wedge X_j = \min\{X_i, X_j\}$ A ternary logic circuit performs a logical operation of the ternary functions. A logic gate having a single input is a monadic gate, and a truth table according to each input is illustrated in the following Table 3.

TABLE 3

| Input | NTI | STI | PTI | BUF |
|---|---|---|---|---|
| 0 | 2 | 2 | 2 | 0 |
| 1 | 0 | 1 | 2 | 1 |
| 2 | 0 | 0 | 0 | 2 |

A logic gate having two inputs, such as MAX gate or MIN gate, is a dyadic gate. The ternary logic circuit may be configured as a ternary logic gate using various methods with respect to a logic circuit having many inputs.

Ternary Logic Circuit Synthesis

Figure 2:
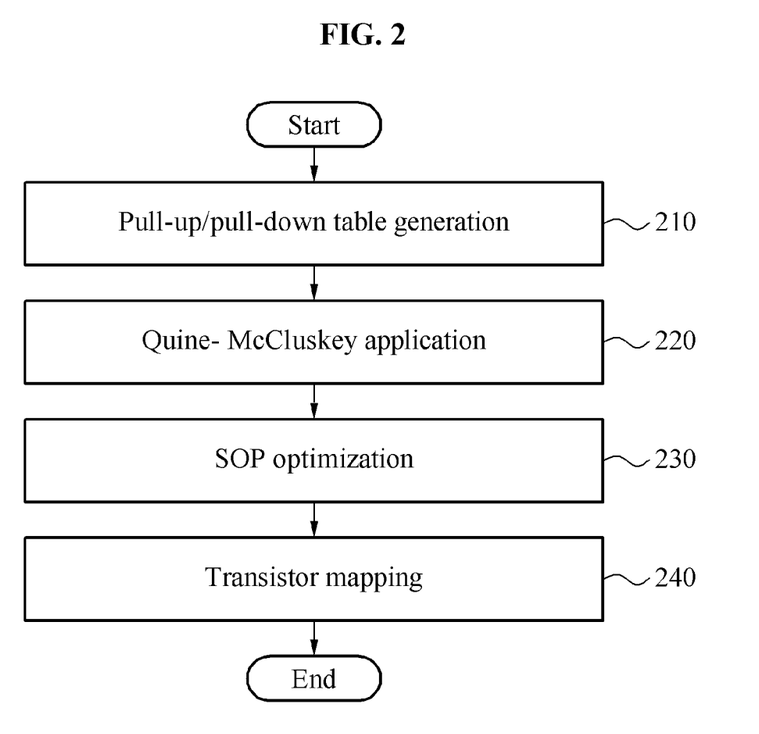
FIG. 2 is a flowchart illustrating a ternary logic synthesis method according to an example embodiment.

FIG. 2 is a flowchart illustrating a ternary logic synthesis method according to an example embodiment. The ternary logic synthesis method may include pull-up/pull-down table generation operation 210, Quine-McCluskey application operation 220, SOP optimization operation 230, and transistor mapping operation 240.

The ternary logic synthesis method first generates a pull-up table and a pull-down table of a VDD/Gnd path, and a pull-up table and a pull-down table of a half-VDD path using a truth table representing ternary functions. Each pull-up/pull-down table represents a switching operation of a corresponding network. Don't-care terms appear in the pull-up/pull-down table of the Half-VDD path, and need to be processed differently from those in the pull-up/pull-down table of the VDD/Gnd path. By inserting ON or OFF into all the don't-care terms, pull-up/pull-down tables of all possible half-VDD paths are generated.

Next, a modified Quine-McCluskey algorithm is applied to all the pull-up/pull-down tables of the VDD/Gnd path and the half-VDD path. The algorithm converts all parts having the ON state in the pull-up/pull-down tables into minterm canonical expressions. The converted minterms decrease through a repetitive merging process, and generate one or more SOPs.

Next, an SOP which optimizes the ternary logic circuit is selected through SOP optimization operation. Last, a suitable transistor may be mapped using the selected SOP. Each operation will be described further below.

Pull-up/pull-down table generation operation 210 is an operation of generating a pull-up/pull-down table from a ternary truth table of a ternary logic. A ternary logic gate has four networks, and the networks perform different switching operations. Thus, a pull-up or pull-down table is needed for each network. Each table includes an input terminal and an output terminal. The input terminal includes all possible variable combinations, and is the same as an input terminal of the truth table. When the number of variables is n, $3^n$ input combinations are generated. The output terminal includes ON or OFF, which indicates an ON/OFF switching operation of a network with respect to a corresponding input combination.

For example, when a current flows in a network with respect to a predetermined input combination, a switch of the network is ON, and an output thereof is ON. In detail, if an output of the pull-up table of the VDD/Gnd path is ON when an input variable A is logic 0 and an input variable B is logic 2, a current flows in the pull-up network of the VDD/Gnd path with respect to the corresponding input combination.

Depending on switching operations of pull-up/pull-down networks to be generated from the truth table, four pull-up/pull-down tables may be obtained.

With respect to the pull-up table of the VDD/Gnd path, an output of the pull-up table is ON when an output of the truth table is logic 2, and the output of the pull-up table is OFF in the other case.

With respect to the pull-down table of the VDD/Gnd path, an output of the pull-down table is ON when the output of the truth table is logic 0, and is OFF in the other case.

With respect to the pull-up table of the half-VDD path, an output of the pull-up table is ON if the output of the truth table is logic 1, and the output of the pull-up table is a don't-care term if the output of the truth table is logic 2. The portion indicates that the corresponding input combination have no effect on a switching operation of a network. The output of the pull-up table is OFF in the other case, that is, if the output of the truth table is logic 0.

Last, with respect to the pull-down table of the half-VDD path, an output of the pull-up table is a don't-care term when the output of the truth table is logic 0, is ON when the output of the truth table is logic 1, and is OFF when the output of the truth table is logic 2.

Table 4 illustrates pull-up/pull-down tables generated from a truth table provided with respect to a 2-input ternary SUM gate.

TABLE 4

| A | B | Y | VDD/Gnd Up | VDD/Gnd Down | Half-VDD Up | Half-VDD Down |
|---|---|---|---|---|---|---|
| 0 | 0 | 0 | OFF | ON | OFF | X |
| 0 | 1 | 1 | OFF | OFF | ON | ON |
| 0 | 2 | 2 | ON | OFF | X | OFF |
| 1 | 0 | 1 | OFF | OFF | ON | ON |
| 1 | 1 | 2 | ON | OFF | X | OFF |
| 1 | 2 | 0 | OFF | ON | OFF | X |
| 2 | 0 | 2 | ON | OFF | X | OFF |
| 2 | 1 | 0 | OFF | ON | OFF | X |
| 2 | 2 | 1 | OFF | OFF | ON | ON |

Minimization for designing a ternary logic circuit with least transistors may be performed using the generated pull-up/pull-down tables. However, before the minimization, don't-care terms (parts marked with X) existing in the pull-up/pull-down tables of the half-VDD path should be processed. Each of the don't-care terms may be replaced with ON or OFF.

All combinations which substitute don't-care terms with ON or OFF need to be considered to optimally synthesize a circuit with respect to a predetermined truth table. Accordingly, with respect to the pull-up/pull-down table of the half-VDD path, all possible pull-up/pull-down tables including only ON or OFF are generated. The pull-up/pull-down tables may be all optimized through a proposed minimization algorithm, and a (ON or OFF) combination with respect to a single don't-care term having least transistors may be selected. The following Table 5 shows pull-up/pull-down tables in which don't-care term are processed so as to have a smallest transistor count with respect to the 2-input ternary SUM gate.

TABLE 5

| A | B | Y | VDD/Gnd Up | VDD/Gnd Down | Half-VDD Up | Half-VDD Down |
|---|---|---|---|---|---|---|
| 0 | 0 | 0 | OFF | ON | OFF | ON |
| 0 | 1 | 1 | OFF | OFF | ON | ON |
| 0 | 2 | 2 | ON | OFF | ON | OFF |
| 1 | 0 | 1 | OFF | OFF | ON | ON |
| 1 | 1 | 2 | ON | OFF | OFF | OFF |
| 1 | 2 | 0 | OFF | ON | OFF | OFF |
| 2 | 0 | 2 | ON | OFF | ON | OFF |
| 2 | 1 | 0 | OFF | ON | OFF | OFF |
| 2 | 2 | 1 | OFF | OFF | ON | ON |

Next, in Quine-McCluskey application operation 220, the minimization may be performed using a modified Quine-McCluskey algorithm, as a non-limiting example.

An objective of the modified Quine-McCluskey algorithm is to convert a provided minterm canonical expression into an SOP expression having least transistors. An implicant $Imp_i$ is defined as a product term which covers at least one minterm, and a prime implicant $PrImp_i$ is defined as a product term that may not be combined with another implicant any further.

The modulated Quine-McCluskey algorithm may be divided into two operations, which will be described in detail below.

The first operation is an operation of finding all prime implicants by repetitively combining implicants. Minterms are extracted from generated pull-up/pull-down tables. The extracted minterms are input combinations corresponding to parts in which an output is ON in the pull-up/pull-down tables. The minterms are set to initial values of the implicants. When the implicants are generated, the implicants may be classified into groups depending on the number of 1 s and the number of 2 s when indicated with trit expressions. For example, a prime implicant A1132 has one 1 and one 2, and thus may be classified as a group [1, 1]. After the grouping is performed, whether the implicants may be combined with other adjacent implicants is verified. If a group of a predetermined implicant is [x, y], groups adjacent to the group are groups [x−1, y], [x+1, y], [x, y−1], [x, y+1], [x−1, y+1], and [x+1, y−1]. Two different implicants having adjacent groups and with a single trit difference may be combined. All combined implicants are stored in $Imp_{mrg}$. After the repetitive merging process, implicants that may not be combined any further are stored in PrImp, and the repetition is performed until there are no further implicants that may be combined.

In the second operation, SOPs are obtained using a sum of appropriate prime implicants. A prime implicant (PI) chart is configured with the prime implicants obtained in the first operation. Columns of the PI chart are expressed with a decimal number of a minterm, and rows thereof are configured with the generated prime implicants. The prime implicant is a reduced product term including at least one minterm. In the PI chart, an asterisk is placed at an intersection between a prime implicant and a minterm covered by the prime implicant. If a single asterisk is present in a column, the corresponding minterm may be covered by only one prime implicant. In this example, the prime implicant is essential for a provided ternary function. After all essential prime implicants are obtained, a combination of nonessential prime implicants that may cover all the remaining uncovered minterms is found. Last, an SOP is obtained by combining the essential prime implicants and the required nonessential prime implicants.

Table 6 through Table 8 show processes of minimization using the modified Quine-McCluskey algorithm with respect to the 2-input ternary SUM gate.

TABLE 6

| Implicant | Group |
|---|---|
| $A_0B_2$ | [0, 1] |
| $A_1B_1$ | [2, 0] |
| $A_2B_0$ | [0, 1] |

|  | 2 | 4 | 6 |
|---|---|---|---|
| $A_0B_2$ | * |  |  |
| $A_1B_1$ |  | * |  |
| $A_2B_0$ |  |  | * |

$U_{0/2} = A_0B_2 + A_1B_1 + A_2B_0$

TABLE 7

| Implicant | Group |
|---|---|
| $A_0B_0$ | [0, 0] |
| $A_1B_2$ | [1, 1] |
| $A_2B_1$ | [1, 1] |

|  | 0 | 5 | 7 |
|---|---|---|---|
| $A_0B_0$ | * |  |  |
| $A_1B_2$ |  | * |  |
| $A_2B_1$ |  |  | * |

$D_{0/2} = A_0B_0 + A_1B_2 + A_2B_1$

TABLE 8

| Implicant | Group |
|---|---|
| $A_0B_1$ | [1, 0] |
| $A_0B_2$ | [0, 1] |
| $A_1B_0$ | [1, 0] |
| $A_2B_0$ | [0, 1] |
| $A_2B_2$ | [0, 2] |
| $A_0(B_1 + B_2)$ | [1, 1] |
| $(A_0 + A_2)B_2$ | [0, 2] |
| $(A_1 + A_2)B_0$ | [1, 1] |
| $A_2(B_0 + B_2)$ | [0, 2] |

|  | 1 | 2 | 3 | 6 | 8 |
|---|---|---|---|---|---|
| $A_0(B_1 + B_2)$ | * | * |  |  |  |
| $(A_0 + A_2)B_2$ |  | * |  |  | * |
| $(A_1 + A_2)B_0$ |  |  | * | * |  |
| $A_2(B_0 + B_2)$ |  |  |  | * | * |

$U_1 = A_0(B_1 + B_2) + (A_0 + A_2)B_2 + (A_1 + A_2)B_0$

TABLE 9

| Implicant | Group |
|---|---|
| $A_0B_0$ | [0, 0] |
| $A_0B_1$ | [1, 0] |
| $A_1B_0$ | [1, 0] |
| $A_2B_2$ | [0, 2] |
| $A_0(B_0 + B_1)$ | [1, 0] |
| $(A_0 + A_1)B_0$ | [1, 0] |

TABLE 9-continued

|  | 0 | 1 | 3 | 8 |
|---|---|---|---|---|
| $A_2B_2$ |  |  |  | * |
| $A_0(B_0 + B_1)$ | * | * |  |  |
| $(A_0 + A_1)B_0$ | * |  | * |  |

$D1 = A_2B_2 + A_0(B_0 + B_1) + (A_0 + A_1)B_0$

After minimization is performed when the pull-up/pull-down tables of Table 5 are input as an input of the algorithm, SOPs with respect to the pull-up/pull-down networks of the VDD/Gnd path are $A_0B_2+A_1B_1+A_2B_0$ and $A_0B_0+A_1B_2+A_2B_1$, and SOPs with respect to the pull-up/pull-down networks of the half-VDD path are $A_0(B_1+B_2)+(A_0+A_2)B_2+(A_1+A_2)B_0$ and $A_2B_2+A_0(B_0+B_1)+(A_0+A_1)B_0$.

SOP optimization operation 230 is an operation of selecting a most optimal SOP when a plurality of minimized SOPs is generated with the modified Quine-McCluskey algorithm. In the SOP optimization operation, the optimal SOP is determined in view of two factors.

First, a network should have a smallest transistor count. Second, a transmission delay of the network should be minimized. A logic gate may be configured to reduce the transmission delay by minimizing the number of CNTFETs having a chirality vector (10,0).

In detail, it is assumed that a predetermined SOP (hereinafter, SOP1) is the optimal SOP (OSOP). Then, to verify whether the predetermined SOP is the optimal SOP, all remaining SOPs excluding the predetermined SOP are compared to the OSOP. With respect to all the SOPs, a transistor count required for configuring a network based on each SOP is calculated.

When there is a single variable in Table 2 provided above, the term $A_0+A2$ and the term $A_1$ require two transistors, and the other terms require only one transistor. Thus, a weight of "2" is applied to the two terms, and a weight of "1" is applied to the other terms.

The transistor count is equal to a sum of numbers of weighted terms. For example, a transistor count required for $A_2B_2+A_0(B_0+B_1)+(A_0+A_1)B_0$ is "6" in total, except for an NTI gate and a PTI gate needed in front of the gate node of the CNTFET.

The transistor count calculated for each SOP is compared to the transistor count of the OSOP. Based on a result of the comparing, an SOP requiring a fewer number of transistors is determined as the OSOP.

Next, if the required transistor counts are the same, the transmission delay may decrease depending on a type of the CNTFET. If a transistor count of a current OSOP is less than a transistor count required for an SOP compared therewith, the current OSOP is maintained as the OSOP. By selecting an SOP requiring fewer transistors as the OSOP, it is possible to reduce a power consumption and a required area of a circuit and maximize a speed of the circuit.

Meanwhile, by reducing the number of CNTFETs having a chirality vector (10, 0), the transmission delay of the circuit may be reduced. In a case of configuring a network, two types of CNTFETs having chirality vectors of (10, 0) and (19, 0) may be used. A CNTFET having a chirality vector of (13, 0) is used to divide a voltage to generate a voltage level of $V_{DD}/2$.

A chirality vector is inversely proportional to a threshold voltage of a CNTFET. Thus, a threshold voltage of the CNTFET having the chirality vector of (10, 0) is greater than a threshold voltage of the CNTFET having the chirality vector of (19, 0). Accordingly, a lower drain current flows in the CNTFET having the chirality vector of (10, 0).

Consequently, the transmission delay of the logic gate increases as the drain current decreases. Thus, when networks are configured with the same number of transistors, the transmission delay may be reduced by reducing the number of CNTFETs having the chirality vector of (10, 0).

Transistor mapping operation 240 is an operation of configuring networks by connecting suitable devices together with the static gate design after the SOP optimization operation.

With respect to each product term of an SOP, two transistors are connected in series by connecting a drain node of a predetermined transistor and a source node of a subsequent transistor. Similarly, the SOP may be configured by connecting generated product models in parallel. In a pull-up network, the product models may be connected in parallel by connecting source nodes of top transistors of the product models and connecting drain nodes of bottom transistors of the product models.

An NTI or PTI gate is added in front of a gate node of the CNTFET, and each logic gate may be configured with two transistors. To minimize a total transistor count of the circuit, the NTI or PTI gate with respect to the same variable may be shared to be used.

Last, the logic gate may be synthesized by suitably connecting nodes of the networks as shown in FIG. 1. According to the ternary logic synthesis method, a ternary logic circuit may be synthesized with least transistors, and the transmission delay of the logic gate may be reduced. The ternary logic synthesis method has been described exemplarily using the unbalanced ternary logic, but may also be applied to the balanced ternary logic in the same manner.

Performance of Synthesized Ternary Logic Circuit

Figure 4:
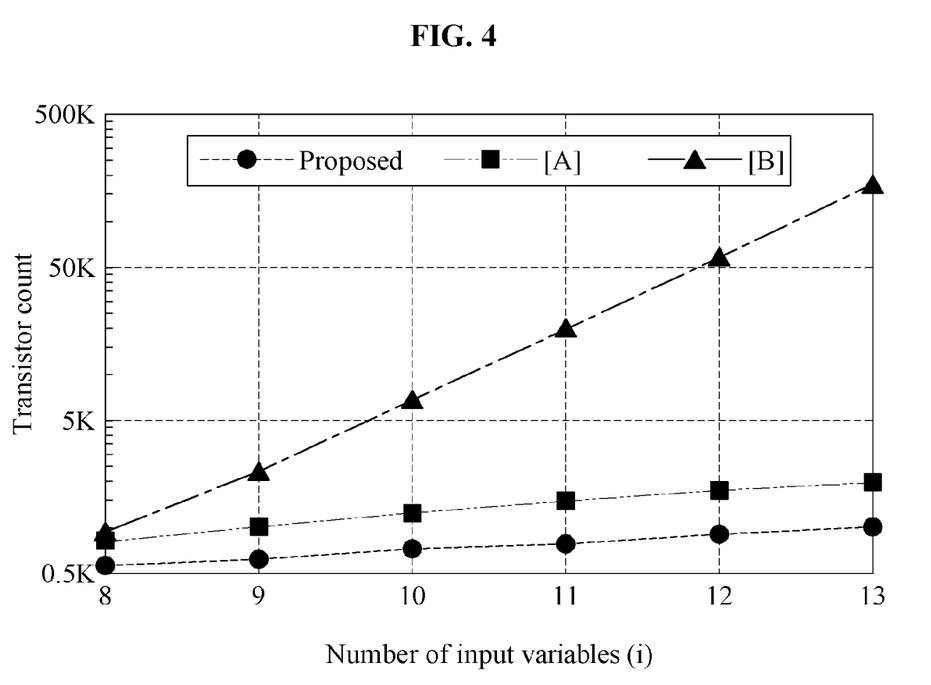
FIG. 4 illustrates a transistor count varying depending on the number of input variables according to an example embodiment.

FIG. 4 illustrates a transistor count varying depending on the number of input variables according to an example embodiment. A shows a transistor count when a ternary logic circuit is designed based on a 2:1 multiplexer, and B shows a transistor count when a ternary logic circuit is designed based on a 3:1 multiplexer.

As a non-limiting example, FIG. 4 illustrates a transistor count used in each sum circuit using a log scale, when a sum, logic circuit adding i ternary input variables is synthesized.

In the case of being based on the 2:1 multiplexer, an increase in the transistor count may be alleviated some extent even then input variables increase. However, when the ternary logic synthesis method according to an example embodiment is used, the transistor count may be minimized.

When a ternary logic circuit is synthesized using the method according to an example embodiment, the power-delay product may improve while the transistor count is minimized. The power-delay product is a product of an average power consumption and a maximum transmission delay of the circuit, which is an index indicating the performance. In detail, the ternary logic circuit synthesized using the method according to an example embodiment exhibits a reduced average power consumption and a reduced maximum transmission delay, when compared to the existing logic circuit. The effects described above are illustrative only and are not limited thereto.

The units described herein may be implemented using a hardware component, a software component and/or a combination thereof. A processing device may be implemented using one or more general-purpose or special purpose computers, such as, for example, a processor, a controller and an arithmetic logic unit (ALU), a DSP, a microcomputer, an FPGA, a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A ternary logic synthesis method at least temporarily performed by a computer, the ternary logic synthesis method comprising:

generating a switching table with respect to pull-up and pull-down circuits using a truth table corresponding to a ternary function;

processing a don't-care term of the switching table;

after the processing, converting the switching table into a sum of products (SOP) using a Quine-McCluskey algorithm;

minimizing the SOP; and mapping a transistor corresponding to the SOP.

2. The ternary logic synthesis method of claim 1, wherein the processing comprises processing the don't-care term by inserting ON or OFF into the don't-care term.

3. The ternary logic synthesis method of claim 2, wherein the minimizing comprises:

converting switching tables generated by inserting ON or OFF into the don't-care term, into respective SOPs; and setting an SOP having a smallest transistor count, among the plurality of SOPs generated from the respective switching tables, as a minimized SOP, for each switching table.

4. The ternary logic synthesis method of claim 2, wherein the mapping comprises:

calculating a number of carbon nanotube field-effect transistors (CNTFETs) having a predesignated chirality vector;

selecting an SOP with having the smallest number of CNTFETs having the predesignated chirality vector; and mapping a transistor corresponding to the selected SOP having the smallest number of CNTFETs.

5. A non-transitory computer-readable storage medium storing instructions that, when executed by a processor, cause the processor to perform the ternary logic synthesis method of claim 1.

\* \* \* \* \*